(12) United States Patent
Ho et al.

(10) Patent No.: US 6,498,082 B1
(45) Date of Patent: Dec. 24, 2002

(54) METHOD OF FORMING A POLYSILICON LAYER

(75) Inventors: Won-Joon Ho, Chungcheongbuk-do (KR); Hyung-Sik Kim, Chungcheongbuk-do (KR)

(73) Assignee: Hyundai Electronics Industries Co., Ltd., Kyoungki-Do (KR)

(*) Notice: Subject to any disclaimer, the term of this patent is extended or adjusted under 35 U.S.C. 154(b) by 0 days.

(21) Appl. No.: 09/643,730

(22) Filed: Aug. 23, 2000

(30) Foreign Application Priority Data

Aug. 23, 1999 (KR) ............................................ 99-34962

(51) Int. Cl.$^7$ .......................................... H01L 21/3205

(52) U.S. Cl. ...................... 438/592; 438/198; 438/229; 438/305; 438/532; 438/653; 438/772

(58) Field of Search ........................... 438/592, 301, 438/305, 351, 772, 198, 532; 738/653, 659, 229, 223

(56) References Cited

U.S. PATENT DOCUMENTS

| | | | | |
|---|---|---|---|---|
| 4,914,046 A | * | 4/1990 | Tobin et al. | 438/592 |
| 5,567,638 A | | 10/1996 | Lin et al. | 437/46 |
| 5,652,166 A | * | 7/1997 | Sun et al. | 438/229 |
| 5,877,057 A | * | 3/1999 | Gardner et al. | 438/301 |

* cited by examiner

Primary Examiner—Matthew Smith
Assistant Examiner—Igwe U. Anya
(74) Attorney, Agent, or Firm—Morgan, Lewis & Bockius LLP

(57) ABSTRACT

A method of forming a polysilicon layer includes the steps of: loading a semiconductor substrate in a CVD reactor wherein a gate insulating layer is formed on the substrate; decompressing the reactor; depositing a first polysilicon layer on the substrate by flowing an $SiH_4$ gas into the reactor; forming a plurality of Si—N bonds on the first polysilicon layer by maintaining atmospheric pressure of the reactor by filling the reactor with nitrogen gas; decompressing the reactor; and depositing a second polysilicon layer on the first polysilicon layer by flowing $SiH_4$ gas into the reactor.

10 Claims, 6 Drawing Sheets

METHOD OF FORMING A POLYSILICON LAYER

This application claims the benefit of Application No. 99-34962, filed in Korea on Aug. 23, 1999, which is hereby incorporated by reference.

BACKGROUND OF THE INVENTION

1. Field of the Invention

The present invention relates to a method of forming a polysilicon layer, and more particularly, to a method of forming a polysilicon layer for dual gates.

2. Discussion of the Related Art

A complementary MOSFET (CMOS) consisting of NMOS and PMOS is widely used in the integrated circuit field. As the size of devices is reduced, a $p^+$ polysilicon gate is used for a PMOS device. Degradation of performance characteristics of devices using the $p^+$ polysilicon gate, such as threshold voltage fluctuation and ruined reliance of gate insulating layers, has been observed. This device degradation is a result of penetration of boron into thin gate insulating layers or diffusion of boron into a channel region in a silicon substrate.

Referring to FIG. 1A, a gate oxide layer 2, 80 Å-thick, is formed on an n-type silicon substrate 1. Referring to FIG. 1B, a first polysilicon layer 3, 1000 Å-thick, is deposited on the gate oxide layer 2 by a low-pressure CVD (LPCVD) at 625° C. Referring to FIG. 1C, a silicon nitride layer 4 is generated by nitridizing the first polysilicon layer 3 in $NH_3$ at 900° C. and a pressure of 120 mTorr. Next, the silicon nitride layer 4 is removed by dilute HF (not shown). Nitrogen atoms are distributed on a surface of the first polysilicon layer 3. Referring to FIG. 1D, a second polysilicon layer 5, 1000 Å-thick, is deposited by LPCVD at 625° C. Ion implantation of $BF_2^+$ on the second polysilicon layer 5 is performed with an implant dosage of $5 \times 10^{15}$ ions/cm$^2$ and an implantation energy of 50 keV. A polysilicon oxide layer 6 is formed on an upper part of the second polysilicon layer 5 by a first annealing in $O_2$ ambience at 800° C. for 30 minutes followed by a second annealing in $N_2$ ambience at 900° C.

A nitrogen barrier in the first polysilicon layer 3 prevents fluorine ions from spreading out and also reduces an amount of fluorine ions in the gate oxide layer 6, thereby decreasing the penetration of boron due to fluorine ions. In a $p^+$ polysilicon gate structure of at least two layers of polysilicon, an interface layer 31 between the first polysilicon layer 3 and the second polysilicon layer 5 or between the second polysilicon layer 5 and a third polysilicon layer (not shown) is nitridized by high temperature gas nitridization using $NH_3$ or $N_2O$, thereby generating and accumulating numerous nitrogen atoms at the interface layer 31 as well as at other interface layers between the gate oxide layer 2 and the first polysilicon layer 3. The nitrogen atoms are prevented from spreading out by the fluorine ions.

A conventional method of forming a polysilicon layer uses an active gas, such as $NH_3$ to form an interface layer and requires a subsidiary gas supply. When an $n^+$ gate of NMOS in dual gates is formed, diffusion of arsenic (As) as a dopant in the interface layer is delayed, thereby decreasing doping efficiency. Thus, a previous ion-implantation is required to overcome this decreased doping efficiency. Another dopant, such as phosphorous (P), which has relatively faster diffusion and activation rates than those of As, should be implanted inside the n+ gate to the proper depth. Moreover, dopants accumulate in the interface layer 31 due to diffusion delay to reduce the activation rate, thereby increasing a shear resistance of polysilicon.

SUMMARY OF THE INVENTION

Accordingly, the present invention is directed to a method of forming a polysilicon layer that substantially obviates one or more of the problems due to limitations and disadvantages of the related art. An object of the present invention is to provide a method of forming a polysilicon layer which prevents boron penetration in a PMOS.

Additional features and advantages of the invention will be set forth in the description which follows, and in part will be apparent from the description, or may be learned by practice of the invention. The objectives and other advantages of the invention will be realized and attained by the structure particularly pointed out in the written description and claims hereof as well as the appended drawings.

To achieve these and other advantages and in accordance with the purpose of the present invention, as embodied and broadly described, a method of forming a polysilicon layer includes the steps of: loading a semiconductor substrate in a CVD reactor wherein a gate insulating layer is formed on the substrate; decompressing the reactor; depositing a first polysilicon layer on the substrate by flowing an $SiH_4$ gas into the reactor; forming a plurality of Si—N bonds on the first polysilicon layer by maintaining atmospheric pressure of the reactor by filling the reactor with a nitrogen gas; decompressing the reactor; and depositing a second polysilicon layer on the first polysilicon layer by flowing $SiH_4$ gas into the reactor.

In another aspect of the claimed invention, a method of forming a polysilicon layer includes the steps of: loading a silicon wafer in a CVD vertical reactor, wherein a gate oxide layer is formed on the wafer and wherein the reactor maintains atmospheric pressure at 625° C. and is purged by nitrogen; decompressing the reactor to 50.5 Pa; depositing a first polysilicon layer on the wafer by flowing an $SiH_4$ gas into the reactor; forming a plurality of SiN bonds on the first polysilicon layer by maintaining atmospheric pressure of the reactor by filling the reactor with a nitrogen gas; decompressing the reactor to 50.5 Pa; and depositing a second polysilicon layer on the first polysilicon layer by flowing $SiH_4$ gas into the reactor, wherein the second polysilicon layer is formed to be thicker than the first polysilicon layer.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention. In the drawings.

DETAILED DESCRIPTION OF THE PREFERRED EMBODIMENTS

Reference will now be made in detail to the preferred embodiments of the present invention, examples of which are illustrated in the accompanying drawings.

Figure 1A:
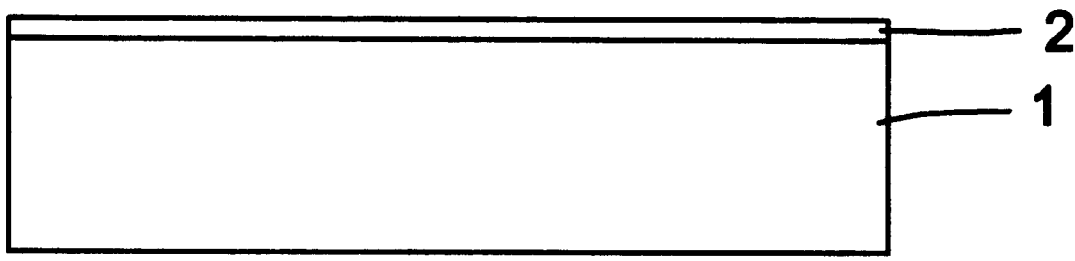
FIGS. 1A to 1D are cross-sectional views of $p^+$ polysilicon gate fabrications according to a conventional method of forming a polysilicon layer.
Figure 1B:
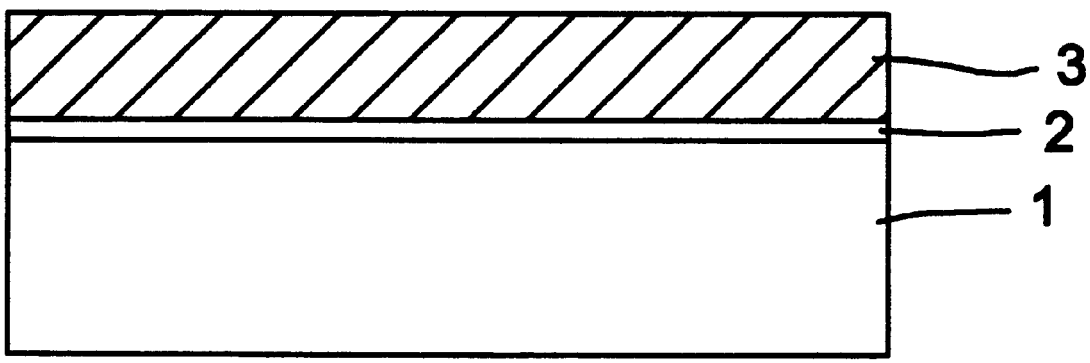
Figure 1C:
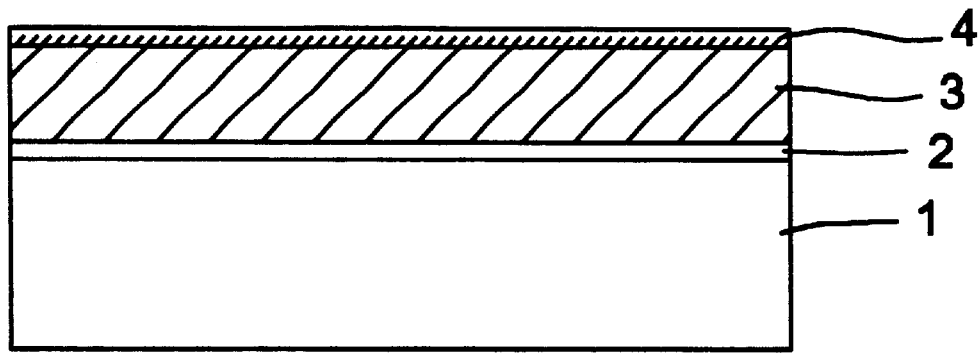
Figure 1D:
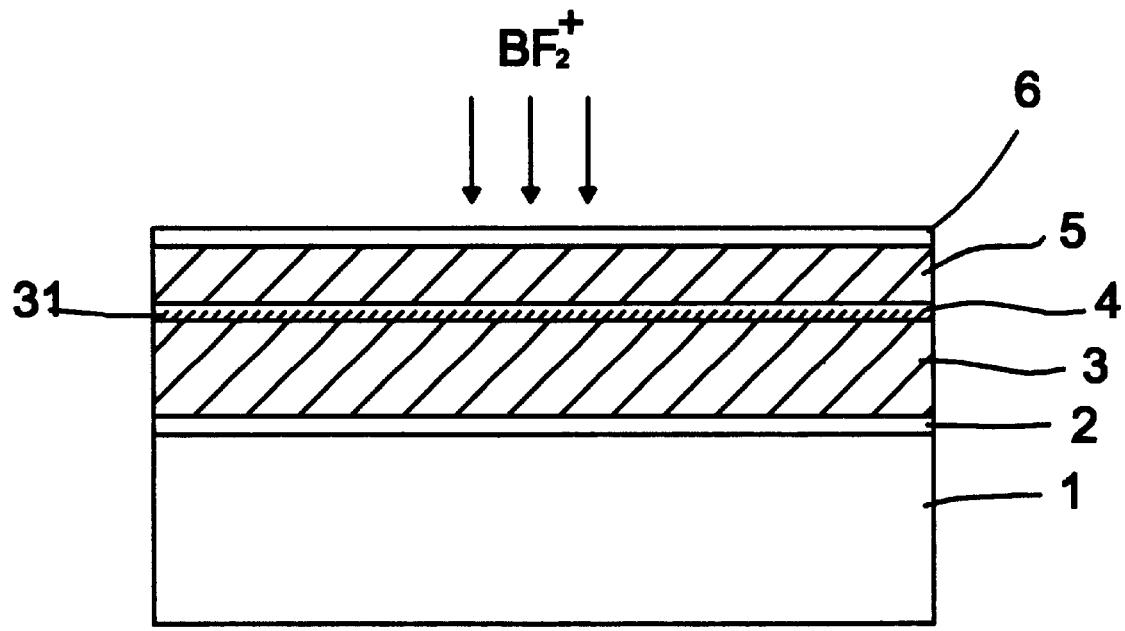
Figure 2:
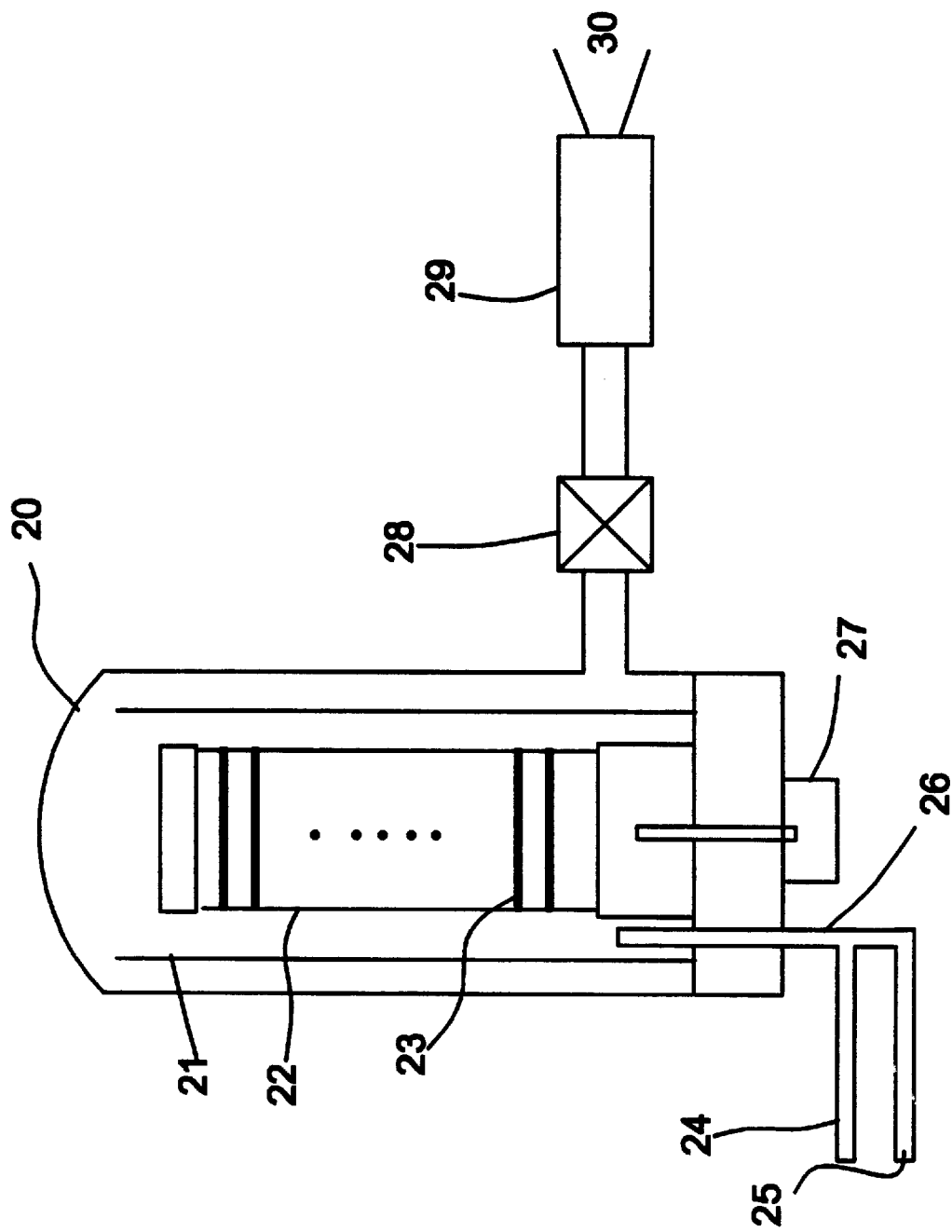
FIG. 2 is a schematic view of a low-pressure CVD (LPCVD) vertical reactor for forming a polysilicon layer according to the invention.

Referring to FIG. 2, a silicon wafer 23 is loaded in a boat 22 surrounded by an inner tube 21 in an LPCVD vertical reactor 20. An $SiH_4$ gas line 24 being diverged and an $N_2$ gas line 25 are connected to the inner tube 21 through a gas injection nozzle 26. A pressure sensor 27 measures pressure inside the reactor 20. The pressure is decompressed by a vacuum pump 29. An automatic pressure control valve 28 located between the vacuum pump 29 and the reactor 20 controls pressure inside the reactor 20. Remaining gases and by-products are transferred to an exhaust 30 through the vacuum pump 29.

Figure 3A:
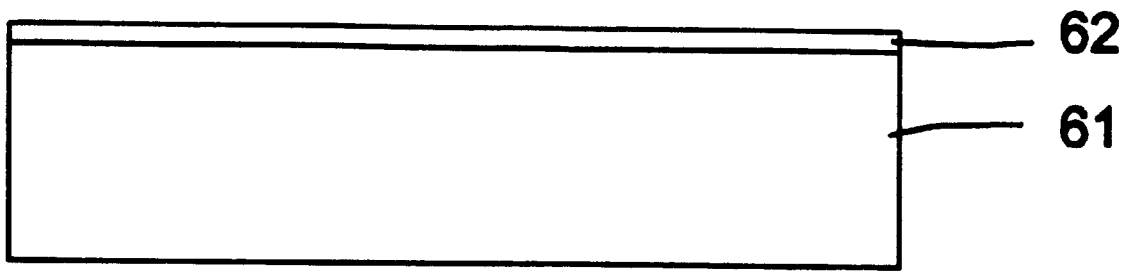
FIGS. 3A to 3C are cross-sectional views of $P^{30}$ polysilicon gate fabrications according to the invention of forming a polysilicon layer.
Figure 3B:
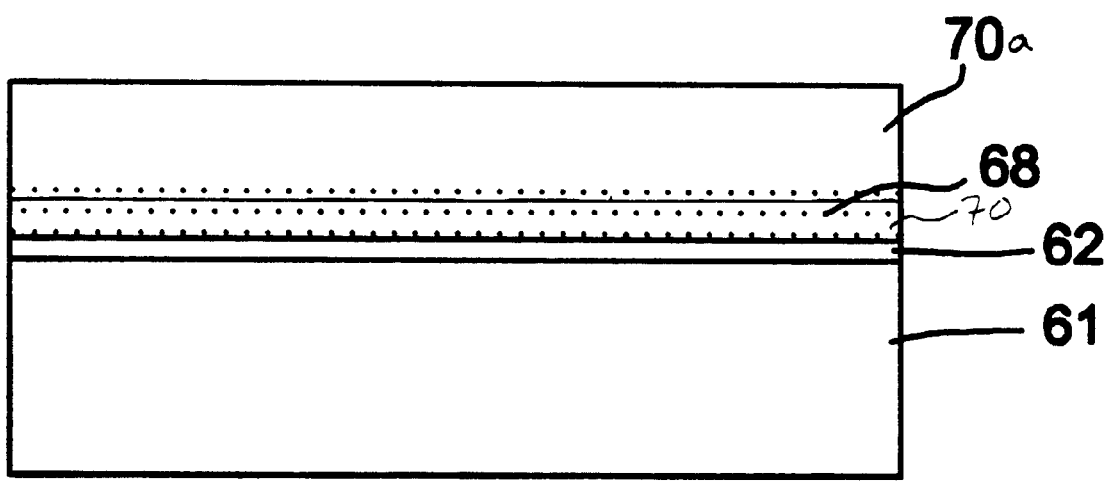

Referring to FIG. 3A, a gate oxide layer 62, 80 Å-thick, is formed on an n-type silicon substrate 61. Referring to FIG. 3B, a polysilicon layer 70, 2000 Å thick, is deposited on the gate oxide layer 62 by LPCVD at 625° C. A process recipe of depositing polysilicon in the reactor 20 is specifically explained as follows.

The silicon substrate 61 on which the gate oxide layer 62 is formed is loaded in the reactor 20 at 625° C. A first polysilicon layer 70, of 300, 500, or 1000 Å thickness, is deposited under vacuum ambience wherein a reactant gas of $SiH_4$ flows into the reactor 20 which maintains a pressure of 50.5 Pa with a deposition rate of 100 Å/min. After the first polysilicon layer 70 has been deposited, the reactor 20 is purged by an $N_2$ gas under vacuum ambience. After purging any remaining gases in the reactor 20, the reactor 20 is increased to atmospheric pressure once a flow rate of the $N_2$ gas is increased to a maximum of 10 liters/min. The reactor 20 is at 625° C. and a process pressure is maintained at atmospheric pressure for a duration of ten minutes. The reactor 20 is vacuum pumped to a vacuum.

A second polysilicon layer 70a over 1000 Å thick is deposited on the first polysilicon layer 70 under vacuum ambience wherein the $SiH_4$ gas flows into the reactor 20 at the deposition rate of 100 Å/min. for ten minutes at 625° C. and 50.5 Pa. Deposition is not complete until a total thickness of both the first polysilicon layer 70 and the second polysilicon layer 70a is 2000 Å.

During the duration of ten minutes that the $N_2$ gas in the reactor 20 is at atmospheric pressure, strong Si—N bonds 68 are formed at an interface between the first polysilicon layer 70 and the second polysilicon layer 70a. Nitrogen density at the interface is approximately $5 \times 10^{18}$ atoms/cm³, but when formed with $N_2$ gas ambience in a vacuum, the nitrogen density is approximately $1 \times 10^{18}$ atoms/cm³.

Figure 3C:
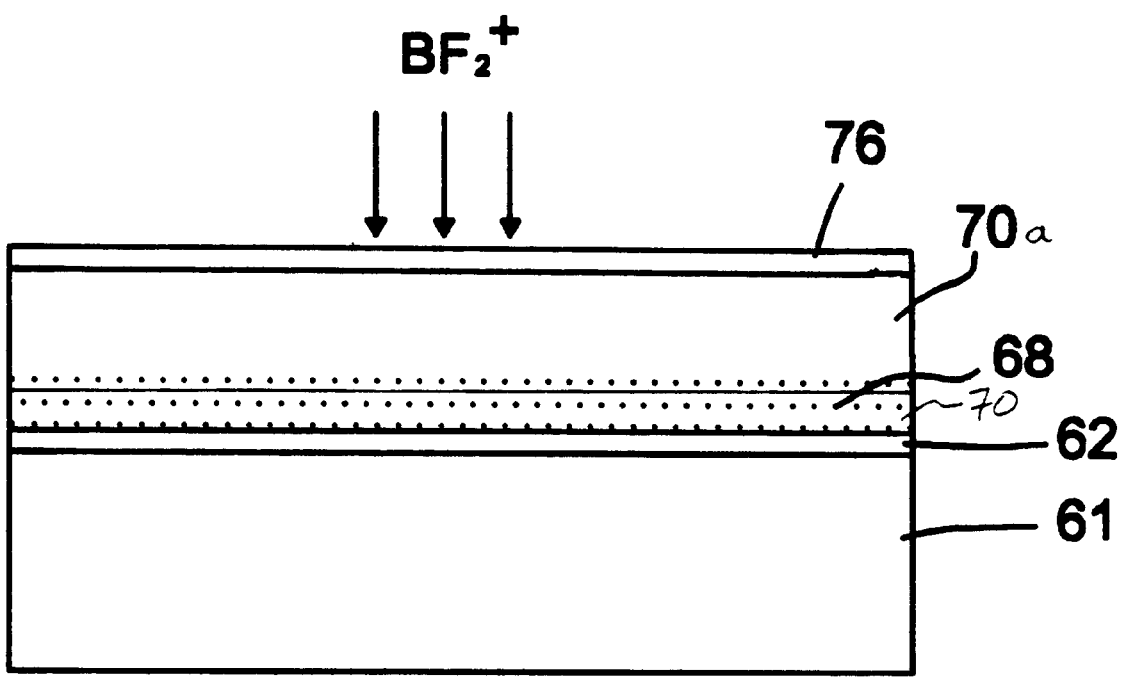

Referring to FIG. 3C, $BF_2^+$ ions are implanted into the second polysilicon layer 70a with an implantation dosage of $5 \times 10^{15}$ ions/cm² and an implantation energy of 50 keV. A polysilicon oxide layer 76 is formed on an upper surface of the second polysilicon layer 70a by a first annealing in an atmosphere of $O_2$ at 800° C. for 30 minutes followed by a second annealing in an atmosphere of $N_2$ at 900° C.

In the explanation above, the Si—N bonds formed at the interface of the first polysilicon layer 70 and the second polysilicon layer 70a prohibit fluorine ions from spreading out and reduce the amount of fluorine ions in the gate oxide layer 62, thus suppressing the effect of boron penetration. After the deposition of the first polysilicon layer under low pressure, the claimed invention generates the strong Si—N bonds 68 which become a diffusion barrier at the interface not by unloading the substrate 61 from the reactor but by maintaining inside the reactor 20 under $N_2$ ambience at atmospheric pressure for ten minutes with the LPCVD equipment.

Figure 4:
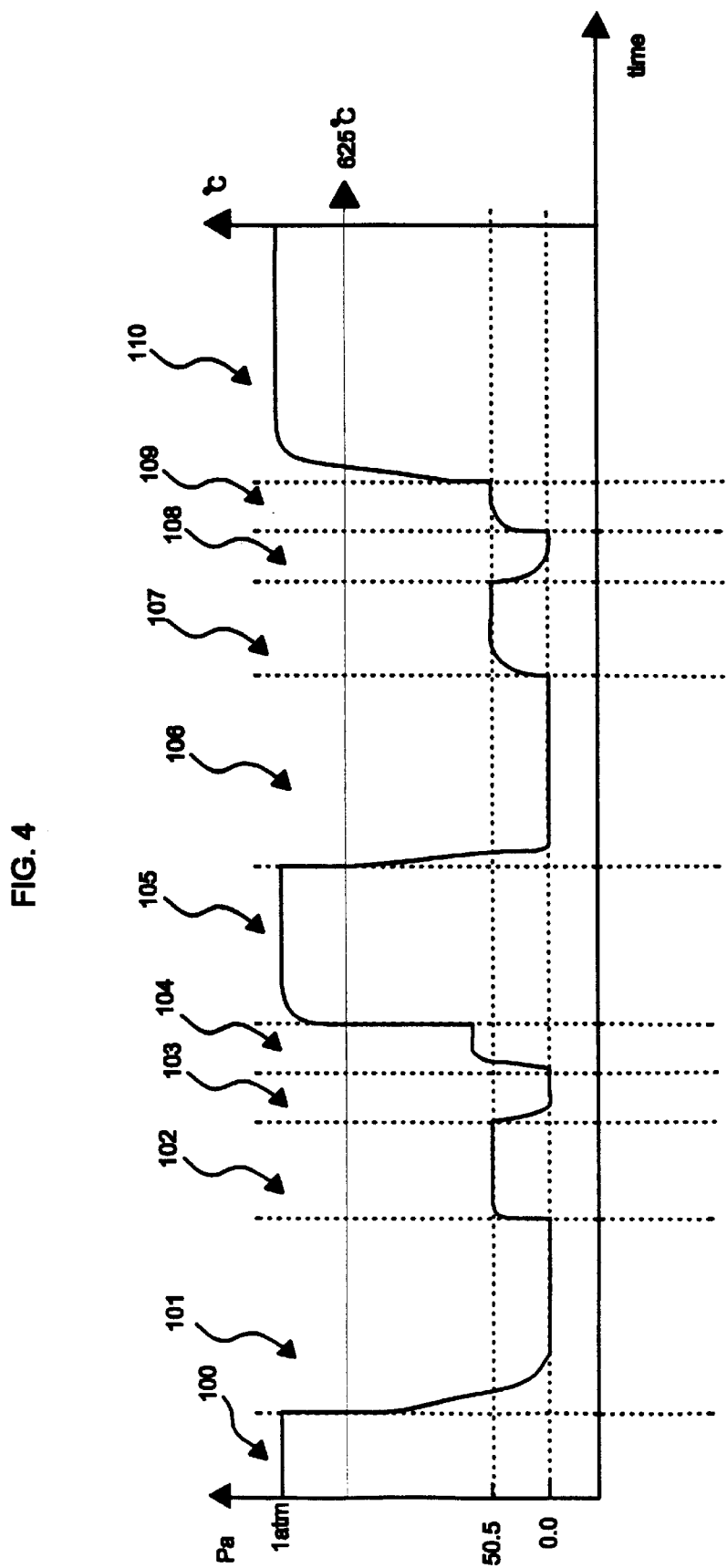
FIG. 4 is a diagram of a preferred process recipe for depositing a polysilicon layer according to the invention.

Referring to FIG. 4, a vertical axis represents pressure in the reactor 20 and a horizontal axis represents intervals of time. In the present invention, as shown in FIG. 4, surface temperature is constant.

During a first time interval 100, a silicon wafer is loaded in a reactor while the reactor is purged by inactive $N_2$ gas. During a second time interval 101, the reactor continues to be purged by the inactive $N_2$ gas until a vacuum in the reactor is achieved. During a third time interval 102, when pressure in the reactor is maintained at 50.5 Pa, a reactant $SiH_4$ gas flows into the reactor at a flow rate of approximately 473 sccm with a deposition rate of 100 Å/min., thereby forming a first polysilicon layer at a thickness of 300, 500, or 1000 Å.

During a fourth time interval 103, the reactor continues to be pumped out by vacuum purging until a vacuum in the reactor is achieved. During a fifth time interval 104, the reactor is purged by the inactive $N_2$ gas to 50.5 Pa. During a sixth time interval 105, pressure in the reactor is brought to atmospheric pressure by filling an active $N_2$ gas back into the reactor. During a duration period of ten minutes, strong Si—N bonds are formed at the interface with a nitrogen density of $5 \times 10^{18}$ atoms/cm³. During a seventh time interval 106, the reactor is purged by the inactive $N_2$ gas until a vacuum is achieved.

During an eighth time interval 107, when pressure in the reactor is maintained at 50.5 Pa, the reactant $SiH_4$ gas flows into the reactor at a flow rate of approximately 473 sccm with a deposition rate of 100 Å/min., thereby depositing a second polysilicon layer. The thickness of the second polysilicon layer 70a is greater than or equal to that of the first polysilicon layer 70. During a ninth time interval 108, the reactor is purged until a vacuum is achieved. During a tenth time interval 109, the reactor is purged by the inactive $N_2$ gas until the reactor reaches 50.5 Pa. During an eleventh time interval 110, purging the reactor by the inactive $N_2$ gas continues until pressure in the reactor reaches atmospheric pressure. The wafer 61 is then unloaded.

It will be apparent to those skilled in the art that various modifications and variations can be made in the method of fabricating a polysilicon layer of the present invention without departing from the spirit or scope of the invention. Thus, it is intended that the present invention cover the modifications and variations of this invention provided they come within the scope of the appended claims and their equivalents.

What is claimed is:

1. A method of forming a polysilicon layer comprising the steps of:

loading a semiconductor substrate in a CVD reactor wherein a gate insulating layer is formed on the substrate;

decompressing the reactor;

depositing a first polysilicon layer on the substrate by flowing an $SiH_4$ gas into the reactor;

forming a plurality of Si—N bonds on the first polysilicon layer by maintaining atmospheric pressure of the reactor by filling the reactor with a nitrogen gas;

decompressing the reactor; and depositing a second polysilicon layer on the first polysilicon layer by flowing SiH$_4$ gas into the reactor.

2. The method of forming a polysilicon layer according to claim 1, wherein the first and second polysilicon layers are deposited successively without unloading the substrate out of the reactor.

3. The method of forming a polysilicon layer according to claim 1, wherein the plurality of Si—N bonds are formed at an interface between the first and second polysilicon layers to prohibit penetration of boron.

4. The method of forming a polysilicon layer according to claim 1, wherein in the step forming the plurality of Si—N bonds, atmospheric pressure is maintained for approximately ten minutes.

5. The method of forming a polysilicon layer according to claim 1, wherein the reactor is filled with the nitrogen gas at a flow rate of 10 liters/minute.

6. The method of forming a polysilicon layer according to claim 1, wherein the reactor is a vertical reactor.

7. The method of forming a polysilicon layer according to claim 1, wherein the first polysilicon layer is thinner than the second polysilicon layer.

8. The method of forming a polysilicon layer according to claim 1, wherein a deposition temperature of the first and second polysilicon layers is approximately 625° C.

9. The method of forming a polysilicon layer according to claim 1, wherein a deposition pressure of the first and second polysilicon layers is approximately 50.5 Pa.

10. A method of forming a polysilicon layer comprising the steps of:

loading a silicon wafer in a CVD vertical reactor, wherein a gate oxide layer is formed on the wafer and wherein the reactor maintains atmospheric pressure at 625° C. and is purged by nitrogen;

decompressing the reactor to 50.5 Pa;

depositing a first polysilicon layer on the wafer by flowing an SiH$_4$ gas into the reactor;

forming a plurality of Si—N bonds on the first polysilicon layer by maintaining atmospheric pressure of the reactor by filling the reactor with a nitrogen gas;

decompressing the reactor to 50.5 Pa; and depositing a second polysilicon layer on the first polysilicon layer by flowing SiH$_4$ gas into the reactor, wherein the second polysilicon layer is formed to be thicker than the first polysilicon layer.

* * * * *